United States Patent [19]

Suzuki

[11] Patent Number: 4,801,867
[45] Date of Patent: Jan. 31, 1989

[54] MONOLITHIC MICROWAVE INTEGRATED CIRCUIT WITH PROBING PADS

[75] Inventor: Tomihiro Suzuki, Osaka, Japan

[73] Assignee: Sumitomo Electric Industries, Ltd., Osaka, Japan

[21] Appl. No.: 119,214

[22] Filed: Nov. 6, 1987

Related U.S. Application Data

[63] Continuation of Ser. No. 904,860, Sep. 8, 1986, abandoned, which is a continuation of Ser. No. 563,981, Dec. 21, 1983, abandoned.

[30] Foreign Application Priority Data

Dec. 13, 1982 [JP] Japan ................................. 57-231306
Feb. 2, 1983 [JP] Japan ................................... 58-16781

[51] Int. Cl.$^4$ .................... G01R 31/02; G01R 31/28;
[52] U.S. Cl. ............................. 324/73 R; 324/158 R; 324/158 T
[58] Field of Search ............. 324/73 R, 158 R, 158 P, 324/158 T; 371/15, 20, 25

[56] References Cited

U.S. PATENT DOCUMENTS

| | | | |
|---|---|---|---|
| 2,668,238 | 2/1954 | Frink | 330/85 |
| 3,781,683 | 12/1973 | Freed | 324/73 R |
| 3,801,905 | 4/1974 | Baker et al. | 324/73 R |
| 3,867,693 | 2/1975 | Saxenmeyer, Jr. | 324/158 P X |
| 3,922,707 | 11/1975 | Freed | |
| 4,237,379 | 12/1980 | Deckert et al. | 324/158 R X |
| 4,479,088 | 10/1984 | Stopper | 324/73 R |
| 4,677,474 | 6/1987 | Sato et al. | 324/158 P X |

FOREIGN PATENT DOCUMENTS

| | | |
|---|---|---|
| 52286 | 9/1970 | Australia . |
| 55657 | 12/1970 | Australia . |
| 997481 | 9/1976 | Canada . |
| 1009763 | 5/1977 | Canada . |
| 0070861 | 8/1982 | European Pat. Off. . |

OTHER PUBLICATIONS

Archer et al.; "A GaAs Monolithic..."; IEEE Journal of Solid-State Circuits; vol. SC. 16; No. 6; Dec. 1981; pp. 648-652.
Honjo et al.; "Ultra-Broad-Band..."; IEEE Trans. on Microwave Theory and Techniques; vol. MTT-30; No. 7; Jul. 1982; pp. 1027-1033.
Nishiuma et al.; "A 2.2 db NF..."; 1983 IEEE International Solid-State Circuits Conference; Digest of Technical Papers; Feb. 24, 1983; pp. 194-195.

Primary Examiner—Ernest F. Karlsen
Assistant Examiner—Vinh P. Nguyen
Attorney, Agent, or Firm—Cushman, Darby & Cushman

[57] ABSTRACT

In monolithic microwave integrated circuits of resistance-capacitance construction, selection after production can be easily performed without sacrificing high frequency characteristics by adding thereto composing pads such as pads for signal, pads for power source, pads for bias and the like and pads for measuring direct current characteristics and selecting chips. Further, said monolithic microwave integrated circuits added with pads for measuring and selecting direct current characteristics can be easily selected by probing them on wafers.

1 Claim, 2 Drawing Sheets

F I G. 1
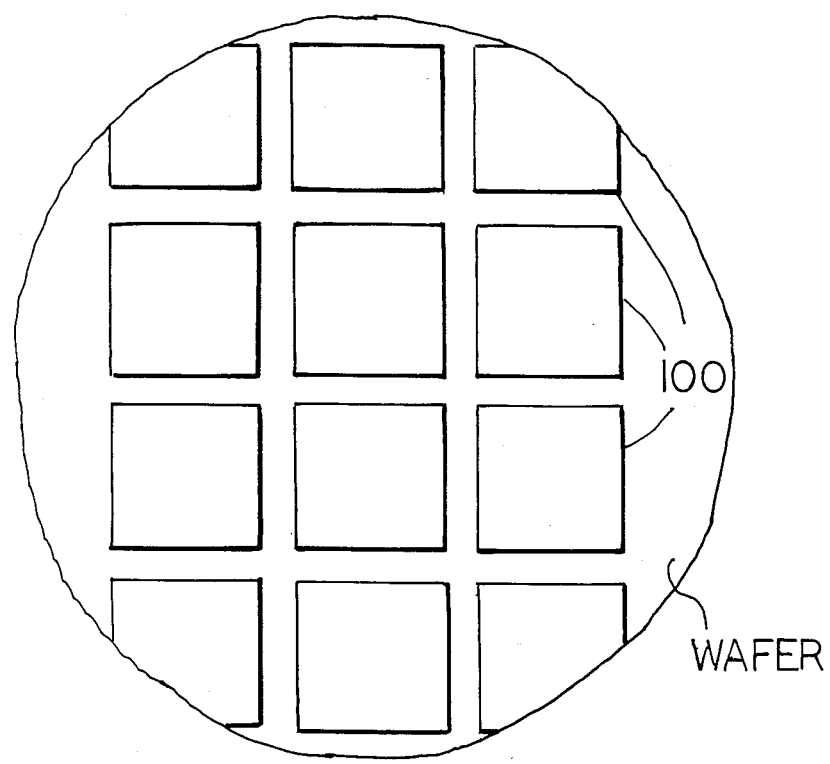

MONOLITHIC MICROWAVE INTEGRATED CIRCUIT WITH PROBING PADS

This is a continuation of application Ser. No. 904,860, filed Sept. 8, 1986, which was abandoned upon the filing hereof, which is a continuation of 563,981 issued 12/21/83, now abandoned.

FIELD OF THE INVENTION

The present invention relates to a monolithic microwave integrated circuit which can be selected easily and produced without a sacrifice in the frequency characteristics. A method is also disclosed for selecting chips of a monolithic microwave integrated circuit simply by proving them on a wafer.

FIELD OF THE ART

A monolithic microwave integrated circuit is produced by assembling MESFET (metal semiconductor field effect transistors), Schottky diodes, inductances and capacitances on the surface of a semiinsulating substrate of, for example, GaAs. Therefore, as compared with a MIC (microwave integrated circuit) the monolithic microwave integrated circuit has advantages that it requires less bonding and trimming of chips and, accordingly, it can reduce the cost remarkably by mass production.

In the heretofore existing technique for producing semiconductor devices, however, it was difficult to make monolithic microwave integrated circuits of equal characteristics in a high reproducibility and, therefore, selection of chips was indispensable thereto. Furthermore, since the monolithic microwave integrated circuits handle high frequency signals, it was difficult to determine the performance of them in the state of wafers by a method such as probing. Heretofore, accordingly, it was a general practice to divide the chip, to assemble it finally, and then to select the chips by high frequency measurement. Since large reductions in cost and time can be expected by simplifying the selection process, there has been a need for a monolithic microwave integrated circuit which can be selected easily and simply and for a simple method for selecting chips of a monolithic microwave integrated circuit.

SUMMARY OF THE INVENTION

An object of the present invention is to provide a monolithic microwave integrated circuit which can be produced without sacrificing frequency characteristics and selected easily after production.

Another object of the present invention is to provide a simple method for selecting monolithic microwave integrated circuits, which can be performed by probing them in the state of wafers.

In order to accomplish these and other objects in the present invention, the monolithic microwave integrated circuit is constructed by assembling composing pads, such as pads for signal, pads for power source, pads for bias and so forth, and pads for measurement of direct current characteristics and selection of chips are added to a monolithic microwave integrated circuit having a resistance-capacitance coupling circuit construction.

Further, in the present invention, since composing pads, such as pads for signal, pads for power source, pads for bias and so forth and pads for measurement of direct current characteristics are added to the monolithic microwave integrated circuit having a resistance-capacitance coupling circuit construction, the direct current characteristics of the component elements of the chip can be measured by probing said pads in the state of a wafer.

BRIEF DESCRIPTION OF THE DRAWINGS

The invention will be better understood from the following description taken in connection with the accompanying drawings in which:

FIG. 1 is a view of a portion of a wafer embodying the present invention;

DESCRIPTION OF THE PREFERRED EMBODIMENTS

The present invention is not limited at all in material. The present invention is applicable to a wide range of general transistor materials such as elemental transistors and compound transistors. In the following description, however, the present invention will be explained with reference to a chip using GaAs as the transistor material, which has an advantage of high operation speed.

Figure 2:
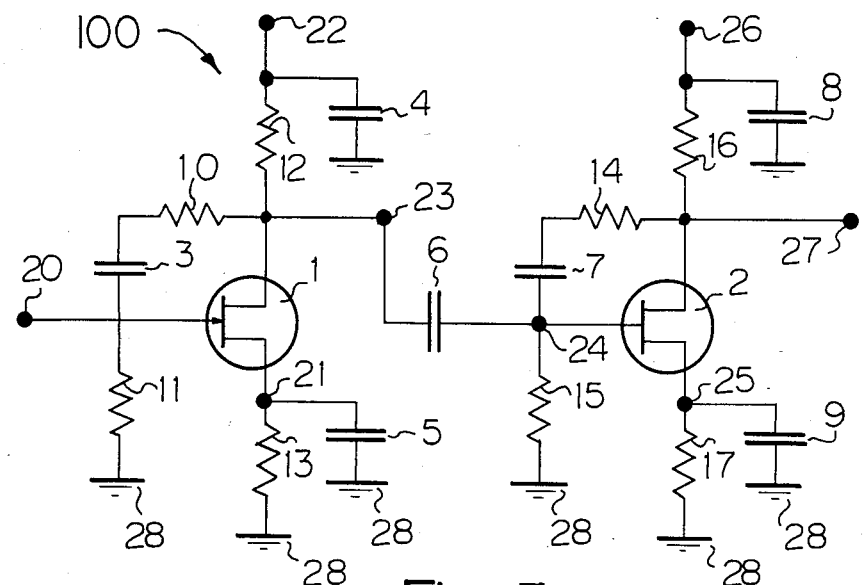
FIG. 2 is a circuit diagram of an embodiment of the present invention showing one of the plurality of identical microwave integrated circuits which are formed on the wafer of FIG. 1.

FIG. 1 shows a view of a portion of a wafer embodying a plurality of identical microwave circuits 100 which are to be diced so as to form separate circuits, and FIG. 2 shows a circuit diagram of an embodiment of the monolithic microwave integrated circuit 100 according to the present invention, in which reference numerals 1 and 2 denote a MESFET, 3 to 9 denote capacitances, and 10 to 17 denote resistances. The interstage coupling in this circuit is the resistance-capacitance coupling.

The method for selection according to the present invention is characterized in that the layout pattern of a monolithic microwave integrated circuit is added with structurally indispensable pads (i.e., pads for signal, pads for power source, pads for bias and the like) and pads for measurement of direct current characteristics and selection of chips.

Figure 3:
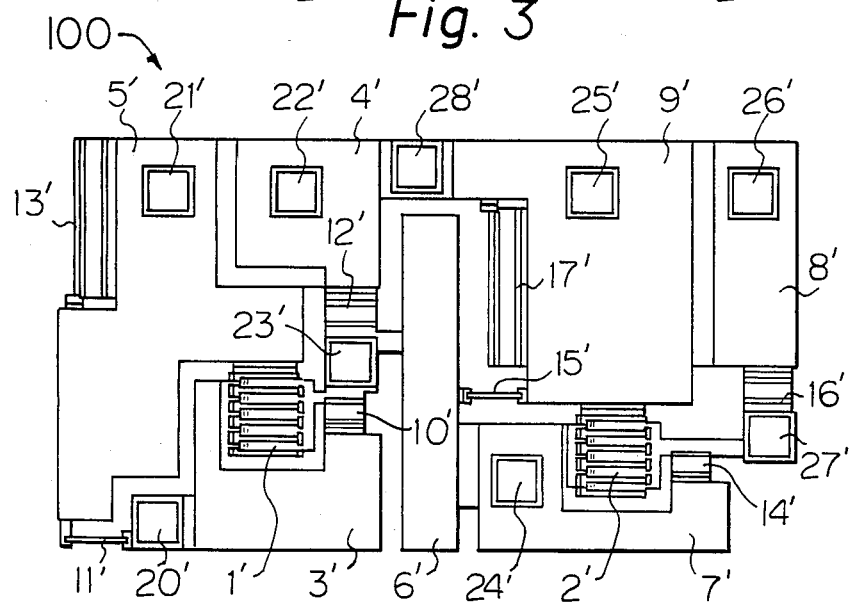
FIG. 3 shows a mask pattern of the circuit of FIG. 2 of the present invention.

FIG. 3 shows an example of the mask pattern of the monolithic microwave integrated circuit according to the present invention, in which reference numerals 1' and 2' denote MESFET, 3' to 9' denote capacitances, and 10' to 17' denote resistances, corresponding respectively to component elements of FIG. 2. Reference numerals 20', 22', 26', 27' and 28' denote structurally indispensable bonding pads, and 21', 23', 24' and 25' denote direct current characteristics measuring and chips selecting pads (or composing pads). Since the monolithic microwave integrated circuit is of the resistance-capacitance coupling circuit construction, the direct current characteristics of MESFET can be measured by combination of these pads. For measuring MESFET 1' and 2', the pads 20', 21', 23' and 24', 25', 27' are used. The pads 20' to 28' correspond to contact points of the corresponding number in the circuit shown in FIG. 2.

Generally, variation in the characteristics of monolithic microwave integrated circuits are dependent greatly upon variation in the characteristics of active elements (MESFET). Efficient selection taking notice to the fact mentioned above is made possible by measuring the direct current characteristics of MESFET using the added pads for measuring the direct current characteristics and selecting chips. The high frequency characteristics of the monolithic microwave integrated circuit, such as the gain of an amplifier circuit, can be easily estimated from the direct current characteristics of MESFET. Further, since the measurement described above does not use high frequency signals, it can be performed by probing or a like method in the state of wafers without the need for division and final assembly of chips previously. This can realize a sharp reduction of producing steps and materials.

Addition of the pads 21', 24' and 25' does not cause any deterioration of the high frequency characteristics because the newly added pads use effectively the upper electrode of the capacitor and the pad 23' is small in area.

As described hereinabove, the monolithic microwave integrated circuit according to the present invention has a great industrial value in that selection of the circuits after production is made very easily without sacrificing the high frequency characteristics by adding the pads for measuring the direct current characteristics and selecting chips. Further, in the method according to the present invention, since the monolithic microwave integrated circuit is probed in the state of a wafer, it is made possible to select the circuits very easily, and to discriminate the quality of the chips before measurement of their high frequency characteristics after assembly steps (dicing, packaging), to thereby realize reduction in time and cost for production.

While the present invention has been described with reference to a specific example of circuit, it is to be distinctly understood that the present invention is not limited thereto but may be otherwise variously applied to monolithic microwave integrated circuits of resistance-capacitance coupling construction.

I claim:

1. A monolithic microwave integrated circuit wafer used as an intermediate product in the production of integrated circuits, comprising:

a substrate; and a plurality of separate and distinct circuits, similar to each other, integrated on the surface of said substrate, each such circuit having at least two stages that are resistance-capacitance coupled to one another, each of said stages including at least one resistor, at least one capacitor having an upper electrode, a transistor and one or more bonding pads, each of said separate and distinct circuits also including composing pads, at least one of which is mounted on said upper electrode of said at least one capacitor in each of the separate and distinct circuits to avoid deterioration of high frequency characteristics, and said composing pads being connected between at least one terminal of said transistor and said at least one resistor in each of said stages for measuring direct current and high frequency characteristics of at least said transistor in each of said circuits to thereby identify inoperative circuits in said plurality of separate and distinct circuits of said substrate so as to aid in chip selection before the substrate is diced into physically separate circuit chips.

* * * * *

UNITED STATES PATENT AND TRADEMARK OFFICE
CERTIFICATE OF CORRECTION

PATENT NO. : 4,801,867
DATED : January 31, 1989
INVENTOR(S) : Tomihiro Suzuki

It is certified that error appears in the above-identified patent and that said Letters Patent is hereby corrected as shown below:

ON THE FIRST INFORMATION PAGE:

Please Change

Item "[30] Foreign Application Priority Data  Dec. 13, 1982" . . .
to
--[30] Foreign Application Priority Data Dec. 23, 1982-- . . .

Signed and Sealed this

Nineteenth Day of September, 1989

Attest:

DONALD J. QUIGG

Attesting Officer

Commissioner of Patents and Trademarks